(12) United States Patent
Tan

(10) Patent No.: US 11,050,037 B2
(45) Date of Patent: Jun. 29, 2021

(54) FULL-SCREEN DISPLAY DEVICE BASED ON FLEXIBLE DISPLAY PANEL

(71) Applicant: Wuhan China Star Optoelectronics Semiconductor Display Technology Co., Ltd., Hubei (CN)

(72) Inventor: Li Tan, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 508 days.

(21) Appl. No.: 16/084,073

(22) PCT Filed: Apr. 19, 2018

(86) PCT No.: PCT/CN2018/083771
§ 371 (c)(1),
(2) Date: Sep. 11, 2018

(87) PCT Pub. No.: WO2019/178908
PCT Pub. Date: Sep. 26, 2019

(65) Prior Publication Data
US 2020/0358025 A1    Nov. 12, 2020

(30) Foreign Application Priority Data

Mar. 21, 2018   (CN) .......................... 201810232975.5

(51) Int. Cl.
*H01L 29/08*   (2006.01)
*H01L 51/52*   (2006.01)
(Continued)

(52) U.S. Cl.
CPC ...... *H01L 51/5237* (2013.01); *H01L 27/3276* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

| 2008/0204367 | A1* | 8/2008 | Lafarre | .................. G09F 9/301 345/55 |
| 2013/0328792 | A1* | 12/2013 | Myers | .................. G06F 3/0485 345/173 |

FOREIGN PATENT DOCUMENTS

| CN | 101213500 A | 7/2008 |
| CN | 101681038 A | 3/2010 |

(Continued)

*Primary Examiner* — Hung K Vu
(74) *Attorney, Agent, or Firm* — Leong C. Lei

(57) ABSTRACT

The invention provides a full-screen display device based on flexible display panel, comprising a housing and a flexible display panel; a first and a second recesses penetrating the flexible display panel in thickness direction being disposed respectively at splicing ends at both ends of the flexible display panel; the two ends of the flexible display panel being spliced together on back of the housing to simultaneously wrap front and back of the housing to form a first display portion covering the front of the housing and a second display portion covering the back of the housing; and the first recess and the second recess communicating and surrounding to form a groove provided for a first element on the housing to pass through. Since the splicing ends of the flexible display panel are located on the back of the housing, the speaker and camera can be placed on the back display.

20 Claims, 4 Drawing Sheets

(51) Int. Cl.
*H01L 27/32* (2006.01)
*H01L 51/00* (2006.01)

(56) References Cited

FOREIGN PATENT DOCUMENTS

| | | |
|---|---|---|
| CN | 202889414 U | 4/2013 |
| CN | 103827770 A | 5/2014 |
| CN | 104335131 A | 2/2015 |
| CN | 205620851 U | 10/2016 |
| NL | 2007427 C | 3/2013 |

\* cited by examiner

FULL-SCREEN DISPLAY DEVICE BASED ON FLEXIBLE DISPLAY PANEL

RELATED APPLICATIONS

The present application is a National Phase of International Application Number PCT/CN2018/083771, filed Apr. 19, 2018, and claims the priority of China Application No. 201810232975.5, filed Mar. 21, 2018.

BACKGROUND OF THE INVENTION

1. Field of the Invention

The present invention relates to the field of display, and in particular to the field of a full-screen display device based on flexible display panel.

2. The Related Arts

At present, the market share of the full-screen display device is getting larger and larger, which further results in the key research in increasing the screen-to-body ratio for the mobile and panel manufacturers.

Both sides of the traditional hard screen need to provide routing space, which is unable to completely eliminate the left and right portions of the outer frame of the display; and at the bottom of the display, due to the need to bind the driver IC or chip-on-film (COF), a certain bonding area must be reserved. Therefore, the traditional hard screen cannot eliminate the bottom portion of the outer frame. The flexible active matrix organic light-emitting diode (AMOLED), which is able to bend, can solve the above problems and is a panel product suitable for high screen-to-body mobile phones. Both the left and right or the bottom portion of the outer frame can be eliminated by bending to the side or back of the mobile phone, thereby increasing the front display area of the mobile phone and overcoming the technical bottleneck of the hard screen.

However, to further increase the screen-to-body ratio, the approach must start with the top of the display. The top front portion of the phone has a front camera and a speaker that occupies a significant portion of the phone display area. Some manufacturers eliminate speaker from the top front of mobile phones by using technologies such as bone conduction. The front camera adopts a sunken design and is placed at the bottom of the mobile phone. Other manufacturers adopt special-shaped screens to dispose slot or opening at the top of the display so that the display area only needs to avoid the front camera and the speaker and the remaining area is entirely for display.

Both of the above methods can effectively increase the screen-to-body ratio, but the former demands very strict acoustic design, which increases the difficulty of design and production for solution providers and integration manufacturers. Because the latter is a special-shaped screen, it has higher requirements for panel manufacturers. When designing the panel, the slot and opening must be avoided when routing, which increases the design difficulty. Also, if the opening drilling process requires very high technique, the yield of the panel cannot be guaranteed. In addition, there are still front camera and speakers on the top front of the display for the above two methods, and further improvement on the screen-to-body ratio is impossible.

SUMMARY OF THE INVENTION

In view of the deficiencies in the known technologies, the present invention provides a flexible display panel and a full-screen display device based on the flexible display panel, which can reduce product design difficulty and further increase the screen-to-body ratio of the display device.

To achieve the above object, the present invention provides the following technical solution:

a full-screen display device based on flexible display panel, which comprises a housing and a flexible display panel; a first recess and a second recess penetrating the flexible display panel in thickness direction being disposed respectively at splicing end surfaces at both ends of the flexible display panel; the two ends of the flexible display panel being spliced together on back of the housing to simultaneously wrap front and back of the housing to form a first display portion covering the front of the housing and a second display portion covering the back of the housing; and the first recess and the second recess communicating and surrounding to form a groove provided for a first element on the housing to pass through.

According to an embodiment of the present invention, the first recess and the second recess are formed respectively at corners of the splicing end surfaces at both ends of the flexible display panel to respectively penetrate corresponding sidewalls of the flexible display panel.

According to an embodiment of the present invention, the first element is a camera and/or a speaker, and the first element is fixed on the housing and disposed inside a space formed by the groove.

According to an embodiment of the present invention, the full-screen display device based on the flexible display panel further comprises a driving chip, and the driving chip is bonded to the flexible display panel and then bent to the back of the flexible display panel.

According to an embodiment of the present invention, the driving chip is bonded to a side of the flexible display panel away from the groove.

According to an embodiment of the present invention, the flexible display panel comprises a flexible substrate and an organic light-emitting diode (OLED) device disposed on the flexible substrate, and the driving chip is bonded on the flexible substrate of the flexible display panel.

According to an embodiment of the present invention, the flexible display panel comprises a flexible substrate, an OLED device disposed on the flexible substrate, and a chip on film (COF) bonded to the flexible substrate at one end; free end of the COF is bent to the back of the flexible substrate and the driving chip is bonded to the free end of the COF.

According to an embodiment of the present invention, end surfaces of the two ends of the flexible display panel are respectively disposed with a third recess and a fourth recess penetrating the flexible display panel in the thickness direction; after the two ends of the flexible display panel are spliced, the first recess and the second recess are oppositely disposed and communicate to form a hole for a second element on the housing to pass through.

According to an embodiment of the present invention, a third display portion connected between the first display portion and the second display portion comprises a non-display portion, and at least a portion of gate on array (GOA) routing is formed in the non-display portion.

According to an embodiment of the present invention, the splicing ends of the two ends of the flexible display panel are a two-layered structure formed by folding toward the back and overlapped.

In the present invention, the flexible display panel is wrapped on the surface of the housing to form a display device having a front display and a back display. Since the splicing end surfaces of the two ends of the flexible display panel are located on the back of the housing, the speaker, the camera, and other similar structure of the display device can be placed on the back display, and the flexible display panel for front display can completely cover the surface of the housing to form a full screen. The grooves or the holes for exposing various elements are both formed by splicing the two ends of the flexible display panel so that the routing of the gate and source of the flexible display panel has very little impact, which reduces the design difficulty.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

The terms "comprising" and "having" and any variations thereof appearing in the specification, claims, and drawings of the present application are intended to cover non-exclusive inclusion. For example, a process, method, system, product, or device that includes a series of steps or units is not limited to the listed steps or units, but optionally also includes steps or units not listed, or alternatively, other steps or units inherent to these processes, methods, products or equipment. In addition, the terms "first", "second" and "third" are used to distinguish different objects, and are not intended to describe a particular order.

Embodiment 1

Figure 1:
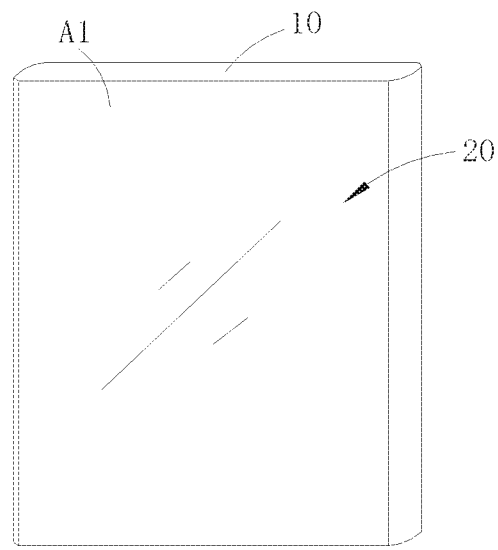
FIG. 1 is a schematic view showing the front structure of the full-screen display device according to the first embodiment of the present invention.
Figure 2:
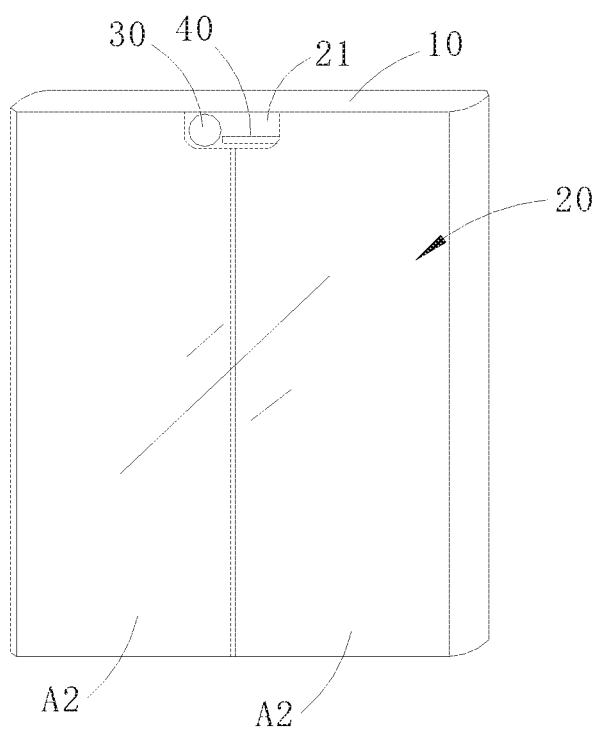
FIG. 2 is a schematic view showing the back structure of the full-screen display device according to the first embodiment of the present invention.
Figure 3:
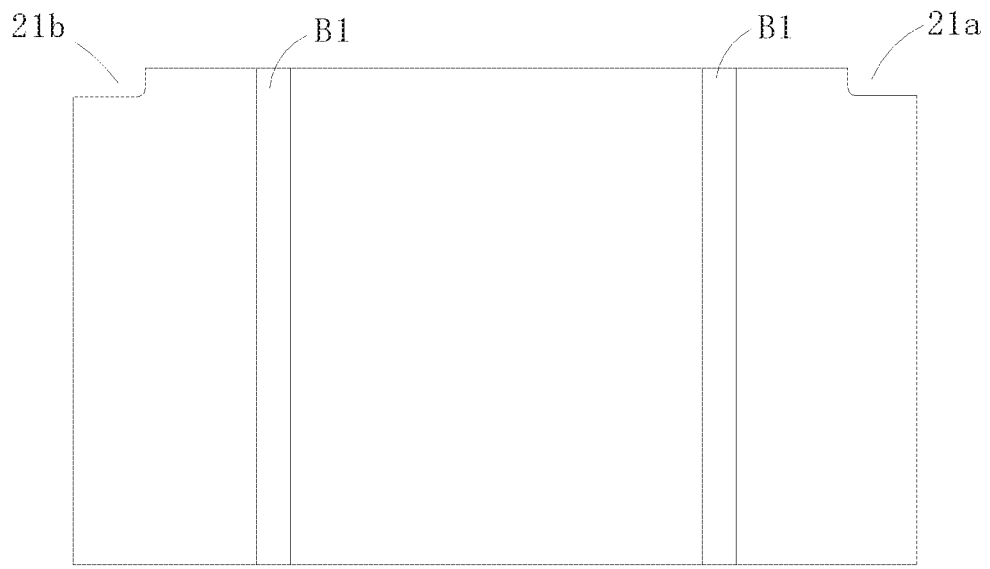
FIG. 3 is a schematic view showing the expanded structure of the flexible display panel according to the first embodiment of the present invention.

Refer to FIGS. 1-3. The present invention provides a full-screen display device based on flexible display panel, which comprises a housing 10 and a flexible display panel 20. Both ends of the flexible display panel 20 in the length direction are splicing ends. The end surfaces of the two splicing ends are disposed respectively with a first recess 21a and a second recess 21b penetrating the flexible display panel 20 in thickness direction.

The two ends of the flexible display panel 20 are spliced together on back of the housing 10 to simultaneously wrap front and back of the housing 10 to form a first display portion A1 covering the front of the housing 10 and a second display portion A2 covering the back of the housing 10, and a third display portion B1 connected between the first display portion A1 and the second display portion A2. The third display portion B1 is attached to the side of the housing 10. The first recess 21a and the second recess 21b communicate with each other and surround to form a groove 21 provided for a first element on the housing 10 to pass through.

The first element may be a camera 30, a speaker 40, or a flashlight, and so on. The groove 21 is in the shape of an elongated strip, the length direction thereof is perpendicular to the spliced joint of the flexible display panel 20, and the camera 30 and the speaker 40 are respectively fixed on the back of the housing 10 and are disposed in a space enclosed by the same groove 21. That is, the first recess 21a and the second recess 21b are respectively formed at the corners of the splicing ends of the two ends of the flexible display panel 20, and respectively penetrating the corresponding sidewalls of the flexible display panel 20.

Figure 4:
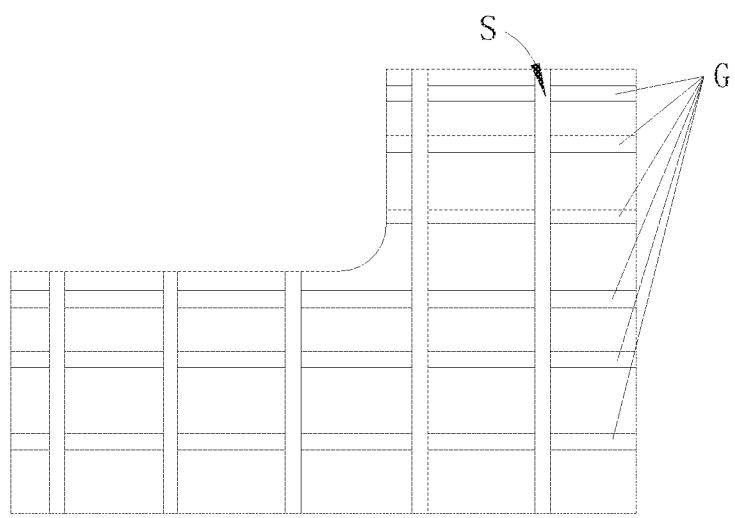
FIG. 4 is a schematic view showing the internal routing of the splicing ends of the flexible display panel according to the first embodiment of the present invention.

Also refer to FIG. 4. The gate routing G and the source routing S are mutually perpendicular. The horizontal gate routing G and the vertical source routing S are cut off at the first recess 21a and second recesses 21b, but the groove 21 is formed by splicing the notch-shaped first recess 21a and second recess 21b at the top of the display device, and the signal conduction is not affected. The present embodiment only needs to open a half recess at the splicing end surfaces of the two ends of the flexible display panel 20, which can avoid the problem and technical difficulty caused by the conventional design needing to drill the hole in the middle of the display screen which is very thin and has many internal wirings. The process to form slot or holes is easier to implement and improves the product yield, thereby reducing the process and production costs.

In other embodiments, the camera 30 and the speaker 40 may not be formed in the same groove 21. For example, two grooves 21 may be arranged side by side in a vertical direction. The upper groove is a notch-shaped groove, and the lower groove may only be formed as a profiled closed slot. The camera 30 and speaker 40 are located in two grooves 21 respectively.

Since the camera 30 and the speaker 40 of the present embodiment are simultaneously located at the second display portion A2 on the back side, the first display portion A1 at the front can completely cover the surface of the housing 10, and the user can only see the first display portion from the front side. A1 and cannot see the housing 10, which achieves a truly full-screen design.

It should be understood that the first display portion A1 and the second display portion A2 may be flat display surfaces, or arc display surfaces having a certain curvature. Correspondingly, the front and back surfaces of the housing 10 are also correspondingly designed to match the shape of the display portions. The first display portion A1 and the second display portion A2 are attached to the front and back surfaces of the housing 10, respectively. When the third display portion B1 connected between the first display portion A1 and the second display portion A2 is also made into a display surface, the appearance of a mobile device such as a mobile phone can be improved.

Embodiment 2

Figure 5:
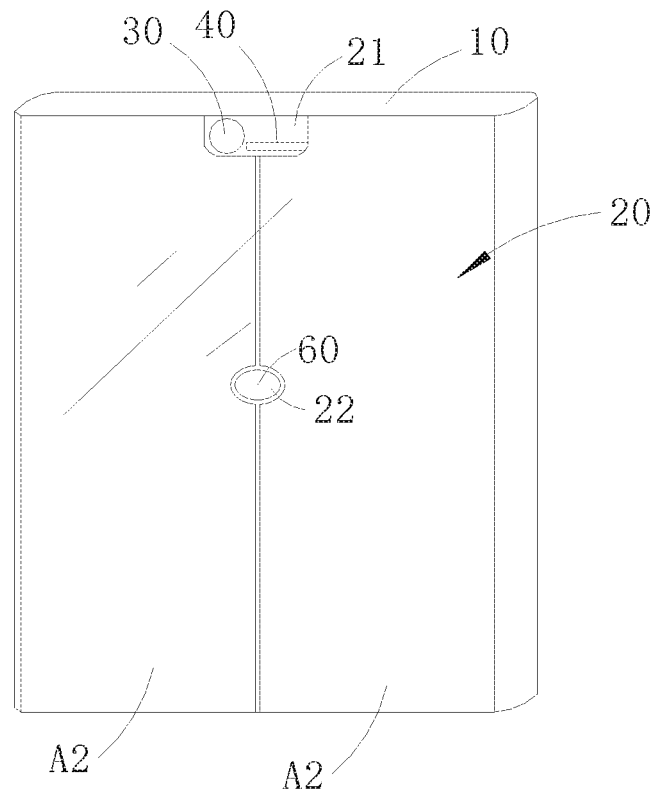
FIG. 5 is a schematic view showing the back structure of the full-screen display device according to the second embodiment of the present invention.
Figure 6:
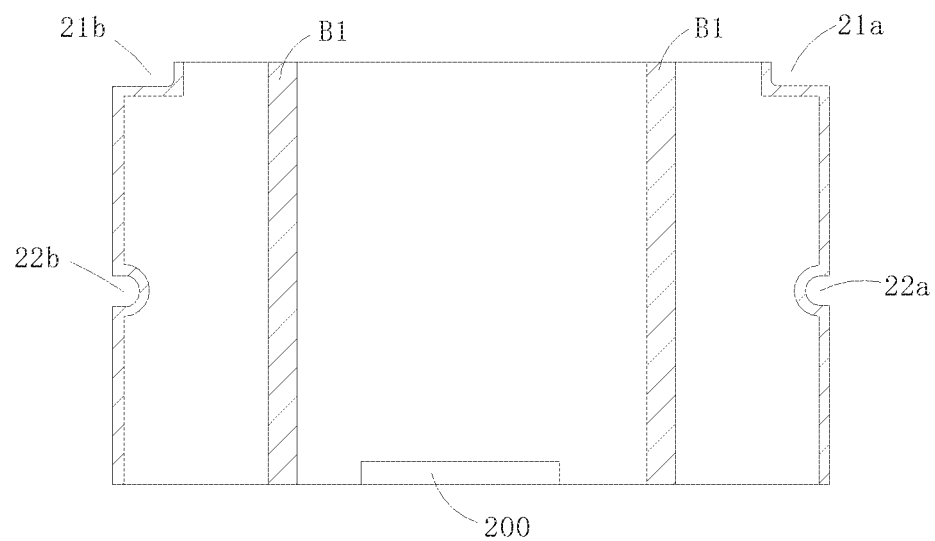
FIG. 6 is a schematic view showing the expanded structure of the flexible display panel according to the second embodiment of the present invention.

As shown in FIG. 5 and FIG. 6, based on the Embodiment 1, the end surfaces of the two ends of the flexible display panel 20 of the present embodiment are disposed respectively with a third recess 22a and a fourth recess 22b penetrating the flexible display panel 20 in the thickness direction; after the two ends of the flexible display panel 20 are spliced, the first recess 21a and the second recess 21b are oppositely disposed and communicate to form a hole 22 for a second element on the housing 10 to pass through. For example, the second element may be a fingerprint identification chip 60.

When the hole 22 is formed in the second display portion A2 on the back of the flexible display panel 20, the third recess 22a and the fourth recess 22b need to be designed only not to cut the vertical source routing S without worrying that the signal cutoff in the horizontal gate routing G caused by the slotting. Compared to the direct slotting in prior art requiring simultaneous avoidance of horizontal and vertical signal lines, the present embodiment can still reduce the design difficulty.

Figure 7A:
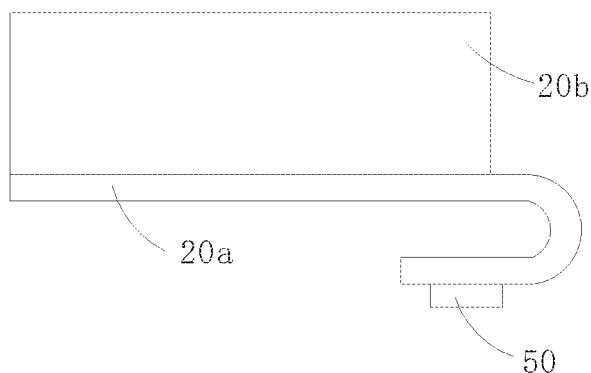
FIG. 7a is a schematic view showing the bonding structure of the flexible display panel according to the second embodiment of the present invention.
Figure 7B:
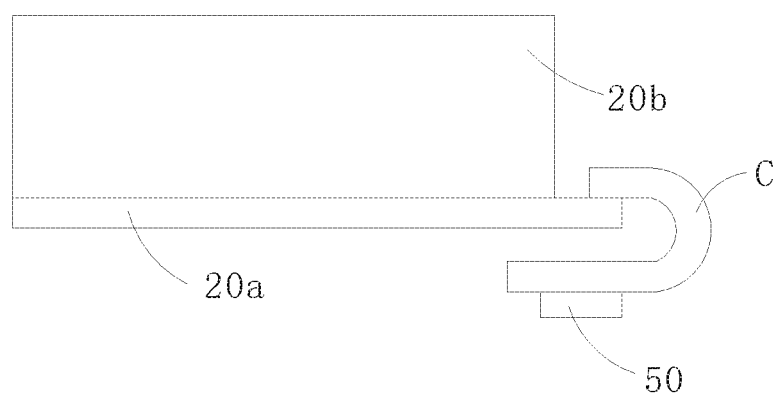
FIG. 7b is a schematic view showing another bonding structure of the flexible display panel according to the embodiment of the present invention.

FIGS. 7a and 7b show two different schematic views of bonding modes of the driving chip 50 according to the present embodiment. The driving chip 50 is bonded to one end of the flexible display panel 20 at the bottom of the display device and then bent to the back of the flexible display panel 20, that is, the bonding end 200 is connected to the first display portion A1, and the driving chip 50 is bonded to the bonding end 200 of the first display portion A1 at the side of the flexible display panel 20 away from the groove 21.

As shown in FIG. 7a, for a chip-on-plastic (COP) bonding mounted on a plastic substrate, the flexible display panel 20 comprises a flexible substrate 20a and an OLED device 20b disposed on the flexible substrate 20a. The driving chip 50 is bonded on the flexible substrate 20a of the flexible display panel 20.

As shown in FIG. 7b, for a chip-on-film (COF) bonding, the flexible display panel 20 comprises a flexible substrate 20a, an OLEO device 20b disposed on the flexible substrate 20a, and a flip-chip film C having an end bonded to the flexible display panel 20a. The free end of the flip-chip film C is bent to the back of the flexible display panel 20a, and the driving chip 50 is bonded to the free end of the flip-chip film C.

Unlike Embodiment 1, in the present embodiment, the third display portion B1 connected between the first display portion A1 and the second display portion A2 comprises a non-display portion, and at least a portion of the GOA routing is formed in the non-display portion so that the non-display outer frame at the edge of the display device can be further narrowed to increase the screen-to-body ratio of the product. Also, the splicing ends of the two ends of the flexible display panel 20 can be bent toward the back side and made into a two-layer structure. That is, the edge portions of both ends of the flexible display panel 20 are reversely bent and affixed on the back side of the flexible display panel 20 so that the frame of the flexible display panel 20 without the display function is hidden in the back and not seen by the user, which also narrows the frame.

In summary, in the present invention, the flexible display panel is wrapped on the surface of the housing to form a display device having a front display and a back display. Since the splicing end surfaces of the two ends of the flexible display panel are located on the back of the housing, the speaker, the camera, and other similar structure of the display device can be placed on the back display, and the flexible display panel for front display can completely cover the surface of the housing to form a full screen. The grooves or the holes for exposing various elements are both formed by splicing the two ends of the flexible display panel so that the routing of the gate and source of the flexible display panel has very little impact, which reduces the design difficulty.

It should be noted that each of the embodiments in this specification is described in a progressive manner, each of which is primarily described in connection with other embodiments with emphasis on the difference parts, and the same or similar parts may be seen from each other. For the device embodiment, since it is substantially similar to the method embodiment, the description is relatively simple and the relevant description may be described in part of the method embodiment.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A full-screen display device based on flexible display panel, comprising a housing and a flexible display panel; a first recess and a second recess penetrating the flexible display panel in thickness direction being disposed respectively at splicing ends at two opposite ends of the flexible display panel; the two ends of the flexible display panel being spliced together on back of the housing to simultaneously wrap front and back of the housing to form a first display portion covering the front of the housing and a second display portion covering the back of the housing; and the first recess and the second recess communicating and surrounding to form a groove provided for a first element on the housing to pass through,
wherein the splicing ends of the two opposite ends of the flexible display panel are connected to each other in order to have the two ends of the flexible display panel spliced together, wherein the first recess and the second recess are respectively formed in the two opposite ends of the flexible display panel such that the first recess and the second recess join each other to form the groove that defines an opening through which the first element on the housing is exposed.

2. The full-screen display device based on flexible display panel as claimed in claim 1, wherein a third display portion connected between the first display portion and the second display portion comprises a non-display portion, and at least a portion of gate on array (GOA) routing is formed in the non-display portion.

3. The full-screen display device based on flexible display panel as claimed in claim 2, wherein the splicing ends of the two ends of the flexible display panel are a two-layered structure formed by folding toward the back and overlapped the back.

4. The full-screen display device based on flexible display panel as claimed in claim 1, wherein the first recess and the second recess are formed respectively at corners of the splicing end surfaces at both ends of the flexible display panel to respectively penetrate corresponding sidewalls of the flexible display panel.

5. The full-screen display device based on flexible display panel as claimed in claim 4, wherein a third display portion connected between the first display portion and the second display portion comprises a non-display portion, and at least a portion of gate on array (GOA) routing is formed in the non-display portion.

6. The full-screen display device based on flexible display panel as claimed in claim 5, wherein the splicing ends of the two ends of the flexible display panel are a two-layered structure formed by folding toward the back and overlapped.

7. The full-screen display device based on flexible display panel as claimed in claim 1, wherein the first element is a camera and/or a speaker, and the first element is fixed on the housing and disposed inside a space formed by the groove.

8. The full-screen display device based on flexible display panel as claimed in claim 1, further comprising a driving chip, and the driving chip is bonded to the flexible display panel and then bent to the back of the flexible display panel.

9. The full-screen display device based on flexible display panel as claimed in claim 8, wherein the driving chip is bonded to a side of the flexible display panel away from the groove.

10. The full-screen display device based on flexible display panel as claimed in claim 9, wherein a third display portion connected between the first display portion and the second display portion comprises a non-display portion, and at least a portion of gate on array (GOA) routing is formed in the non-display portion.

11. The full-screen display device based on flexible display panel as claimed in claim 10, wherein the splicing ends of the two ends of the flexible display panel are a two-layered structure formed by folding toward the back and overlapped.

12. The full-screen display device based on flexible display panel as claimed in claim 9, wherein the flexible display panel comprises a flexible substrate and an organic light-emitting diode (OLED) device disposed on the flexible substrate, and the driving chip is bonded on the flexible substrate of the flexible display panel.

13. The full-screen display device based on flexible display panel as claimed in claim 12, wherein a third display portion connected between the first display portion and the second display portion comprises a non-display portion, and at least a portion of gate on array (GOA) routing is formed in the non-display portion.

14. The full-screen display device based on flexible display panel as claimed in claim 13, wherein the splicing ends of the two ends of the flexible display panel are a two-layered structure formed by folding toward the back and overlapped.

15. The full-screen display device based on flexible display panel as claimed in claim 9, wherein the flexible display panel comprises a flexible substrate, an OLED device disposed on the flexible substrate, and a chip on film (COF) bonded to the flexible substrate at one end; free end of the COF is bent to the back of the flexible substrate and the driving chip is bonded to the free end of the COF.

16. The full-screen display device based on flexible display panel as claimed in claim 15, wherein a third display portion connected between the first display portion and the second display portion comprises a non-display portion, and at least a portion of gate on array (GOA) routing is formed in the non-display portion.

17. The full-screen display device based on flexible display panel as claimed in claim 16, wherein the splicing ends of the two ends of the flexible display panel are a two-layered structure formed by folding toward the back and overlapped.

18. The full-screen display device based on flexible display panel as claimed in claim 1, wherein end surfaces of the two ends of the flexible display panel are respectively disposed with a third recess and a fourth recess penetrating the flexible display panel in the thickness direction; after the two ends of the flexible display panel are spliced, the third recess and the fourth recess are oppositely disposed and communicate to form a hole for a second element on the housing to pass through.

19. The full-screen display device based on flexible display panel as claimed in claim 18, wherein a third display portion connected between the first display portion and the second display portion comprises a non-display portion, and at least a portion of gate on array (GOA) routing is formed in the non-display portion.

20. The full-screen display device based on flexible display panel as claimed in claim 19, wherein the splicing ends of the two ends of the flexible display panel are a two-layered structure formed by folding toward the back and overlapped.

* * * * *